United States Patent
Chien et al.

(10) Patent No.: US 10,453,688 B2
(45) Date of Patent: Oct. 22, 2019

(54) METHOD OF MANUFACTURING A SEMICONDUCTOR DEVICE INCLUDING A TERNARY ALLOY LAYER FORMED BY A MICROWAFE ANNEAL PROCESS

(71) Applicants: TAIWAN SEMICONDUCTOR MANUFACTURING CO., LTD., Hsinchu (TW); NATIONAL CHIAO TUNG UNIVERSITY, Hsinchu (TW)

(72) Inventors: Chao-Hsin Chien, Hsinchu (TW); Chi-Wen Liu, Hsinchu (TW); Chung-Chun Hsu, Hsinchu (TW); Wei-Chun Chi, Hsinchu (TW)

(73) Assignees: National Chiao Tung University, Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 79 days.

(21) Appl. No.: 15/253,074

(22) Filed: Aug. 31, 2016

(65) Prior Publication Data

US 2018/0061642 A1 Mar. 1, 2018

(51) Int. Cl.
*H01L 21/24* (2006.01)
*H01L 21/285* (2006.01)
(Continued)

(52) U.S. Cl.
CPC ........ *H01L 21/244* (2013.01); *H01L 21/2855* (2013.01); *H01L 21/28518* (2013.01); *H01L 21/28525* (2013.01); *H01L 21/28537* (2013.01); *H01L 21/28568* (2013.01); *H01L 29/45* (2013.01); *H01L 29/47* (2013.01);
(Continued)

(58) Field of Classification Search
CPC ..... H01L 21/244; H01L 29/872; H01L 29/47; H01L 21/28568; H01L 21/2855; H01L 29/66143; H01L 29/45; H01L 29/665; H01L 29/66606; H01L 29/6659; H01L 29/66795; H01L 29/16; H01L 21/28537; H01L 21/28518; H01L 21/28525
See application file for complete search history.

(56) References Cited

U.S. PATENT DOCUMENTS 8,487,378 B2  7/2013  Goto et al.
8,729,634 B2  5/2014  Shen et al.
(Continued)

OTHER PUBLICATIONS

Finstad, T. G.; "Silicide Formation with Nickel and Platinum Double Layers on Silicon"; 1978; Thin Solid Films, vol. 51; pp. 411-424.*
(Continued)

*Primary Examiner* — William F Kraig
*Assistant Examiner* — Vicki B. Booker
(74) *Attorney, Agent, or Firm* — McDermott Will & Emery LLP

(57) ABSTRACT

A method of manufacturing a semiconductor device includes forming a first metal layer on a semiconductor substrate and forming a second metal layer on the first metal layer. The second metal layer is formed of a different metal than the first metal layer. Microwave radiation is applied to the semiconductor substrate, first metal layer, and second metal layer to form an alloy including components of the first metal layer, second metal layer, and the semiconductor substrate.

20 Claims, 22 Drawing Sheets

(51) Int. Cl.
*H01L 29/47* (2006.01)
*H01L 29/66* (2006.01)
*H01L 29/872* (2006.01)
*H01L 29/45* (2006.01)
*H01L 29/16* (2006.01)

(52) U.S. Cl.
CPC ........ *H01L 29/665* (2013.01); *H01L 29/6659* (2013.01); *H01L 29/66143* (2013.01); *H01L 29/66606* (2013.01); *H01L 29/66795* (2013.01); *H01L 29/872* (2013.01); *H01L 29/16* (2013.01)

(56) References Cited

U.S. PATENT DOCUMENTS

| | | | |
|---|---|---|---|
| 8,826,213 | B1 | 9/2014 | Ho et al. |
| 8,887,106 | B2 | 11/2014 | Ho et al. |
| 2009/0184399 | A1* | 7/2009 | Kowalski .............. H01L 21/324 257/618 |
| 2012/0126297 | A1* | 5/2012 | Yamaguchi ....... H01L 21/28052 257/288 |
| 2014/0027823 | A1* | 1/2014 | Lee .................... H01L 29/401 257/288 |
| 2014/0282326 | A1 | 9/2014 | Chen et al. |
| 2015/0155366 | A1* | 6/2015 | Lavoie ................. H01L 29/665 438/285 |
| 2015/0287819 | A1 | 10/2015 | Chien et al. |
| 2015/0294881 | A1 | 10/2015 | Tsai et al. |
| 2016/0118298 | A1* | 4/2016 | Alptekin ............... H01L 27/092 438/586 |

OTHER PUBLICATIONS

Hsu et al.; IEEE Transactions on Electron Devices, vol. 63, No. 7, Jul. 2016, "Experimental Realization of a Ternary-Phase Alloy Through Microwave-Activated Annealing for Ge Schottky pMOSFETs"; pp. 2714-2721.*

L.J. Jin et al., "Effect of Pt on agglomeration and Ge out-diffusion in Ni(Pt) germanosilicide", J. Appl. Phys. 98, 033520, (2005) 5 pgs.

Min-Ho Kang et al., "Thermally Robust Ni Germanide Technology Using Cosputtering of Ni and Pt for High-Performance Nanoscale Ge MOSFETs", IEEE Transactions of Nanotechnology, vol. 11, No. 4, Jul. 2012, pp. 769-776.

Ying-Ying Zhang et al., "Improvement of Thermal Stability and Reduction of Schottky Barrier Height of Ni Germanide utilizing Ni-Pt(1%) alloy on Ge-on-Si Substrate", IEEE Transactions on Nanotechnology, vol. 9, issue 2, Jun. 16, 2009, 2 pgs.

Ying-Ying Zhang et al., "Interlayer Dielectric Capping Effect on Thermal Stability of Ni Germanide on Doped Ge-on-Si Substrate for Nano-scale Ge MOSFETs", Proceedings of the World Congress on Engineering 2009, vol. 1 WCE 2009, 4 pgs.

Min-Ho Kang et al., "Thermally Robust Ni Germanide Technology Using Cosputtering of Ni and Pt for High-Performance Nanoscale Ge MOSFETs", IEEE Transactions on Nanotechnology, vol. 11, No. 4, Jul. 4, 2012, pp. 769-776.

* cited by examiner

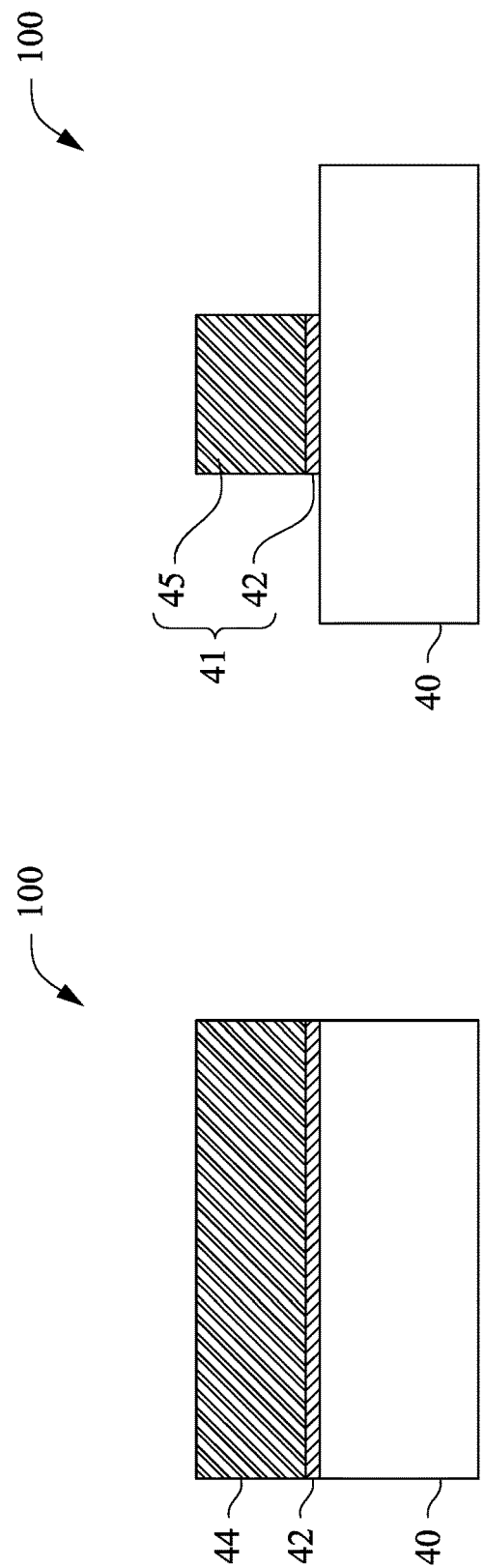

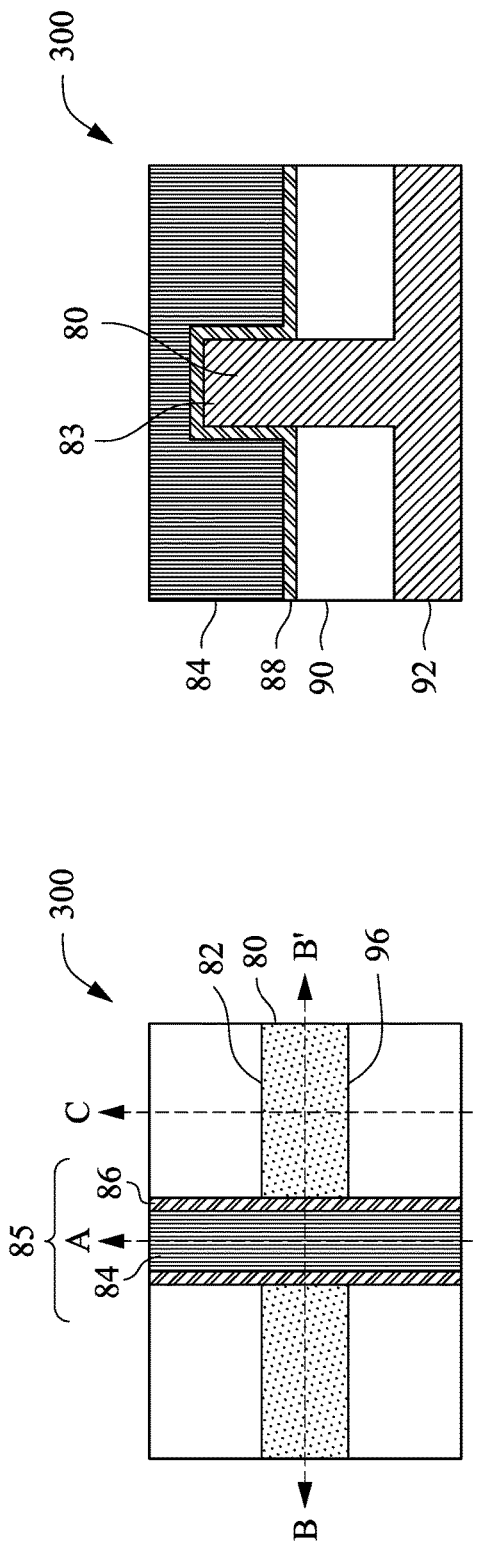
FIG. 32B
FIG. 32A
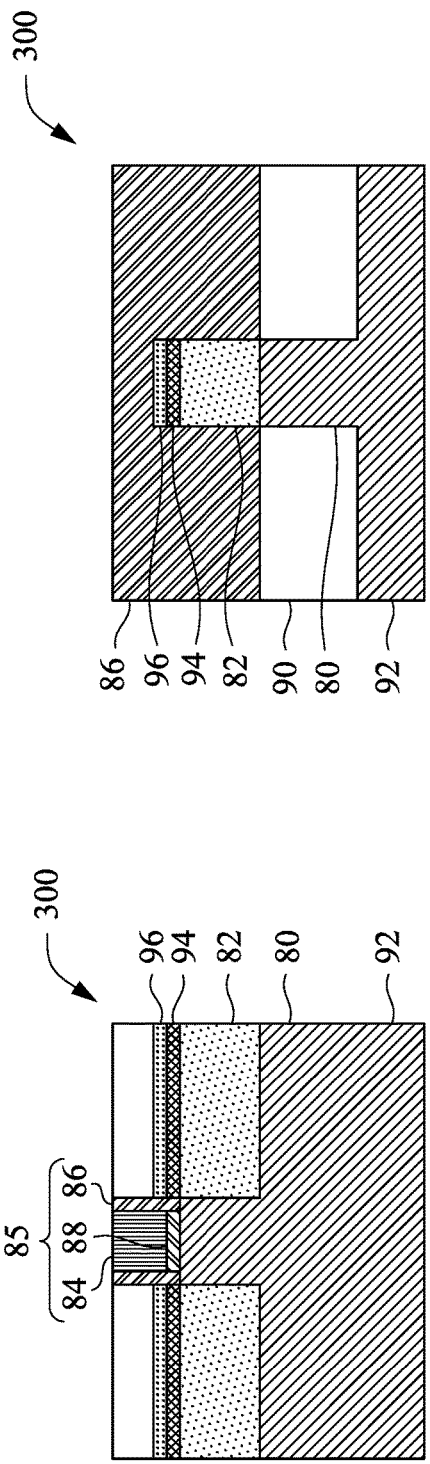
FIG. 32D
FIG. 32C

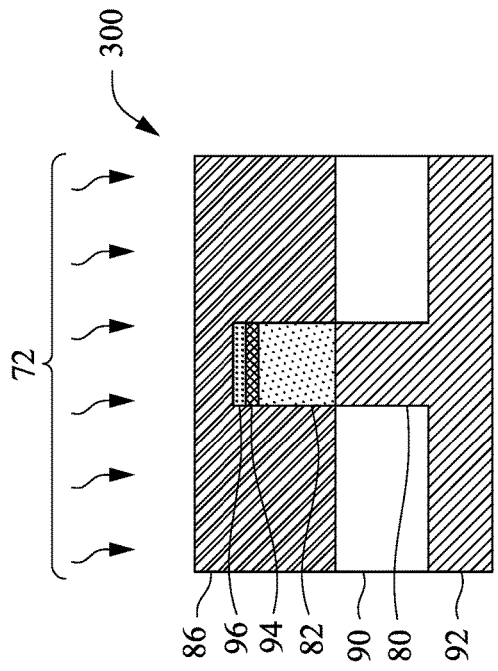
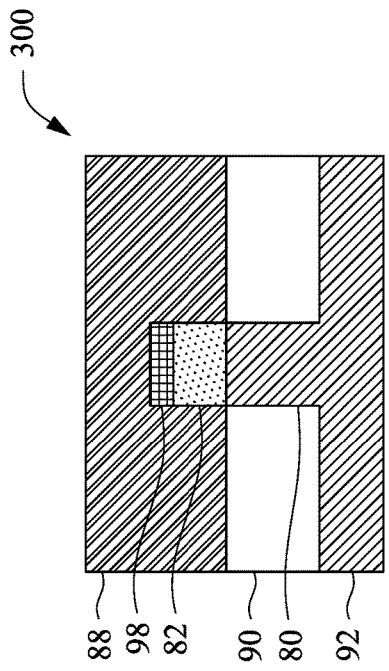
FIG. 33A  FIG. 34A
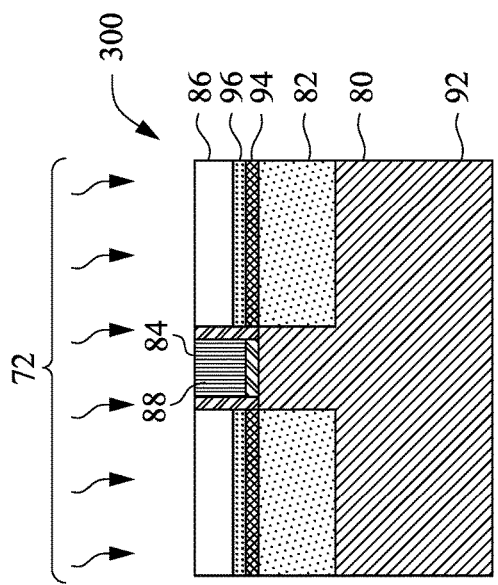
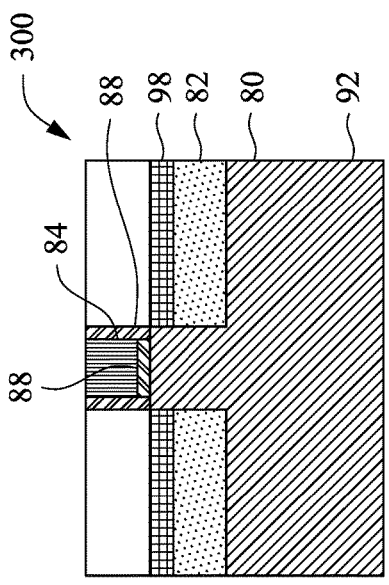
FIG. 33B  FIG. 34B

METHOD OF MANUFACTURING A SEMICONDUCTOR DEVICE INCLUDING A TERNARY ALLOY LAYER FORMED BY A MICROWAFE ANNEAL PROCESS

TECHNICAL FIELD

The disclosure relates to methods of manufacturing semiconductor integrated circuits, more particularly to manufacturing semiconductor devices having field effect transistor (FET) structures.

BACKGROUND

As the semiconductor industry introduces new generations of integrated circuits (ICs) having higher performance and greater functionality, the density of the elements that form the ICs is increased, and the dimensions of metal contacts and wiring decreases, thereby increasing the electrical resistance of the circuits. Reduction of electrical resistance at contact areas is desirable to provide further improvement in ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 15-23 depict a method for manufacturing a field effect transistor semiconductor device according to an embodiment of the present disclosure.

FIGS. 32A-34B depict a method for manufacturing a field effect transistor semiconductor device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Examples of devices that can benefit from one or more embodiments of the present disclosure are Schottky barrier diodes and semiconductor devices with field-effect transistors (FETs). Exemplary field-effect transistors include a metal-oxide-semiconductor (MOS) field effect transistor, such as a p-type FET (PFET) having wells doped with a p-type dopant, such as B or $BF_2$, or an n-type FET (NFET) having wells doped with an n-type dopant, such as P or As. The FETs may be planar devices or three-dimensional (3D) fin-type field-effect transistors, referred to herein as finFET devices. The planar devices refer to non-finFET devices. The finFETs may be multi-gate transistors, such as a dual-gate device, tri-gate device, and/or other configurations. The devices may be included in an IC such as a microprocessor, memory device, and/or other ICs. One of ordinary skill may recognize other embodiments of semiconductor devices that may benefit from aspects of the present disclosure.

One or more techniques for forming a semiconductor device and resulting structures formed thereby are provided herein.

Figure 1:
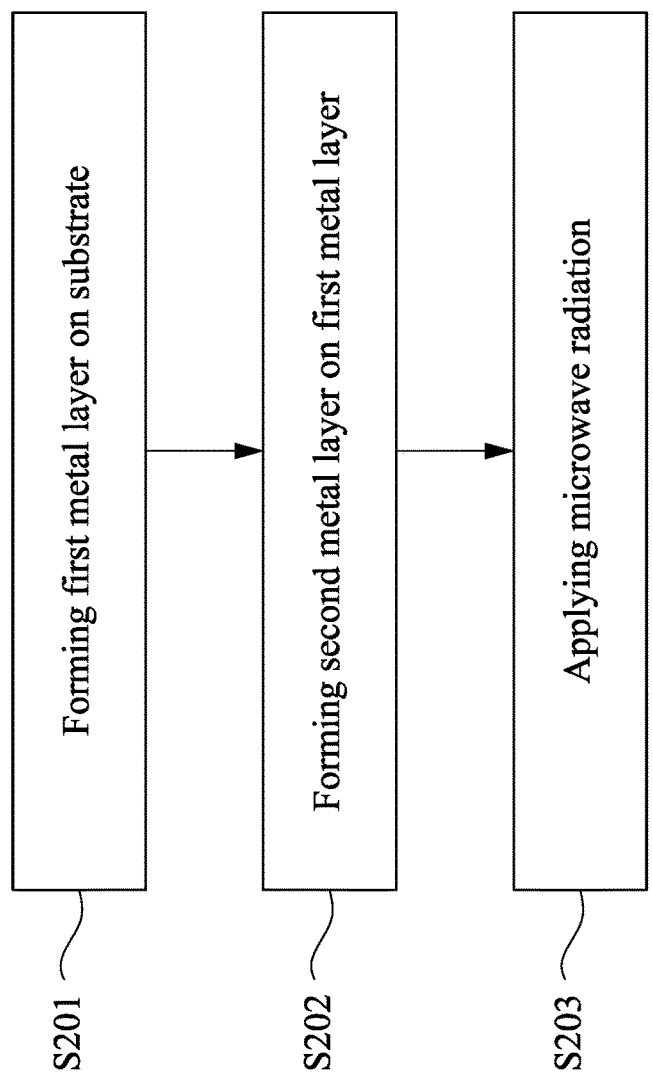
FIG. 1 is a flowchart showing a method of manufacturing a semiconductor device according to an embodiment of the present disclosure.

A flowchart showing a method of manufacturing a semiconductor device according to an embodiment of the present disclosure is depicted in FIG. 1. Forming a first metal layer including a first metal on a semiconductor substrate is performed in operation S201. A second metal layer including a second metal different from the first metal is formed on the first metal layer in operation S202. Microwave radiation is applied to the semiconductor substrate, first metal layer, and second metal layer to form an alloy including components of the first metal layer, second metal layer, and semiconductor substrate in operation S203.

FIGS. 2-12 depict a method for manufacturing a semiconductor device 10 according to an embodiment of the present disclosure. In some embodiments, the semiconductor device 10 formed by the present method is a Schottky barrier diode.

Figure 2:
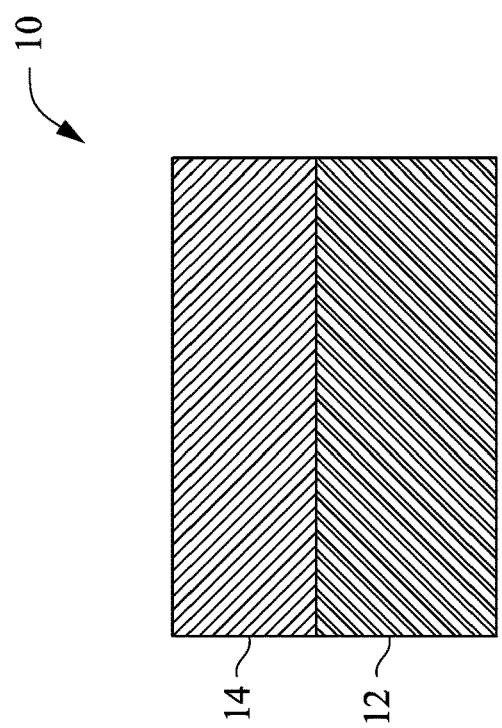

As shown in FIG. 2, a mask layer 14 is formed on a semiconductor substrate 12. The semiconductor substrate 12 may include a single crystalline semiconductor material such as, but not limited to Si, Ge, SiGe. In a certain embodiment, the semiconductor substrate 12 is made of Ge. In certain embodiments, the semiconductor substrate 12 is subjected to a cleaning operation, such as exposing the surface of the semiconductor substrate 12 on which the mask will be deposited to dilute hydrofluoric acid (DHF).

Figure 3:
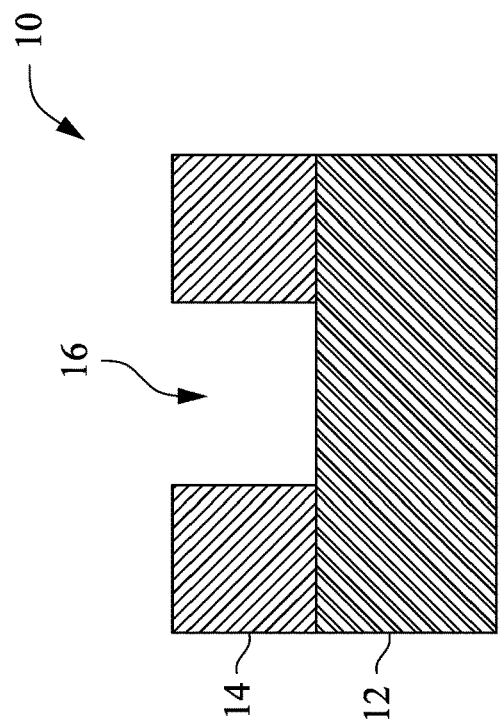
FIGS. 2-12 depict a method for manufacturing a semiconductor device according to an embodiment of the present disclosure.

The mask layer 14 may be any suitable masking material, including a photoresist or a hard mask material, such as an oxide or nitride. The oxide or nitride hard mask material can be deposited by a suitable deposition technique, such as chemical vapor deposition (CVD), including low pressure CVD (LPCVD) and plasma enhanced CVD (PECVD), physical vapor deposition (PVD), and atomic layer deposition (ALD). An opening 16 is subsequently formed in the mask layer 14 exposing a portion of the semiconductor substrate 12 by suitable lithographic and etching operations, as shown in FIG. 3.

Figure 4:
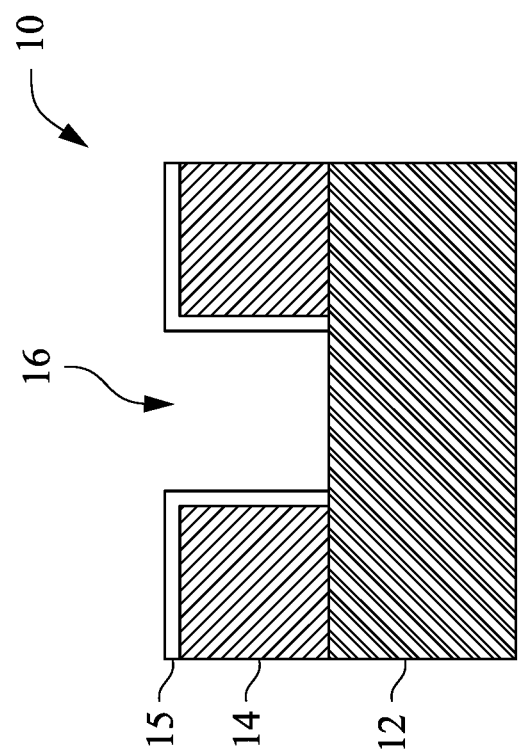

Adverting to FIG. 4, a photoresist layer 15 is deposited over the mask layer 14 and semiconductor substrate 12, and the photoresist layer 15 is patterned using photolithographic operations to expose the semiconductor substrate 12 in the opening 16. The photoresist 15 is a positive photoresist in some embodiments, and a negative photoresist in other embodiments.

Figure 5:
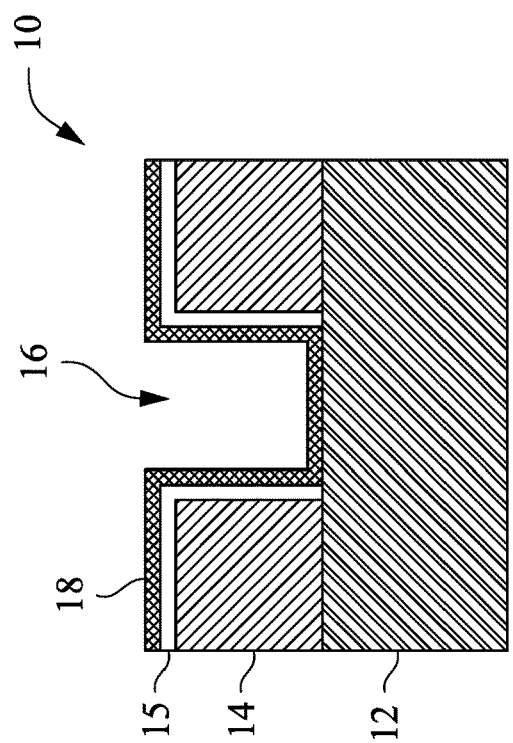

As shown in FIG. 5, a first metal layer 18 is formed on the exposed portion of the semiconductor substrate 12 and the photoresist layer 15 by a suitable deposition technique, such as sputtering or physical vapor deposition. In some embodiments, the first metal layer 18 is formed to a thickness of about 3 nm to about 30 nm. In certain embodiments, the thickness of the first metal layer 18 ranges from about 6 nm to about 14 nm. The first metal layer 18 is at least one selected from the group consisting of Ni, Pt, Au, Ta, Gd, Ti, Ge, and Si in some embodiments.

Figure 6:
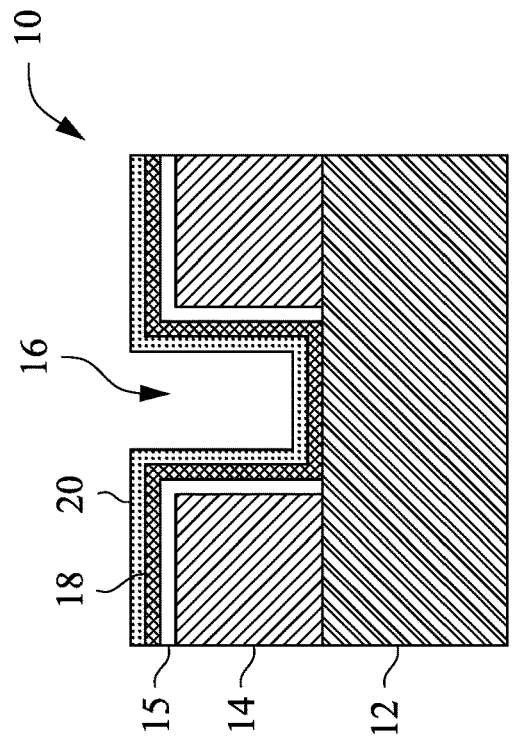

As shown in FIG. 6, a second metal layer 20 is formed on the first metal layer 18 by a suitable deposition technique, such as sputtering or physical vapor deposition. In some embodiments, the second metal layer 20 is formed to a thickness of about 3 nm to about 30 nm. In certain embodiments, the thickness of the second metal layer 20 ranges from about 5 nm to about 15 nm. The second metal layer 20 is at least one selected from the group consisting of Ni, Pt, Au, Ta, Gd, Ti, Ge, and Si in some embodiments. The second metal is a different metal than the first metal.

Figure 7:
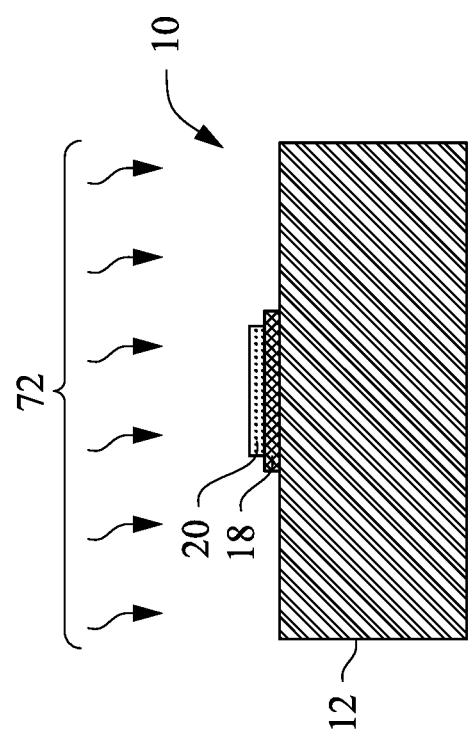

Adverting to FIG. 7, in some embodiments, after the second metal layer is deposited, the photoresist layer 15 and first and second metal layers 18, 20 overlying the photoresist layer 15 are removed by a lift-off operation using an appropriate photoresist solvent, such as acetone. The mask layer 14 is also removed, and a microwave-activated annealing operation is performed to form an alloy contact with the semiconductor substrate 12. The microwave-activated annealing operation includes applying microwave radiation 72 to the semiconductor substrate 12, first metal layer 18, and second metal layer 20, as shown in FIG. 7. In some embodiments, the microwave radiation is applied at frequency range of about 1 GHz to about 30 GHz and at a power of about 0.6 kW to about 4.4 kW for about 40 seconds to about 240 seconds. In other embodiments, the microwave radiation is applied at a power of about 1.2 kW to about 2.2 kW for about 80 seconds to about 120 seconds. In certain embodiments, the semiconductor device 10 is exposed to microwave radiation in an inert atmosphere, such as a nitrogen atmosphere.

Figure 8:
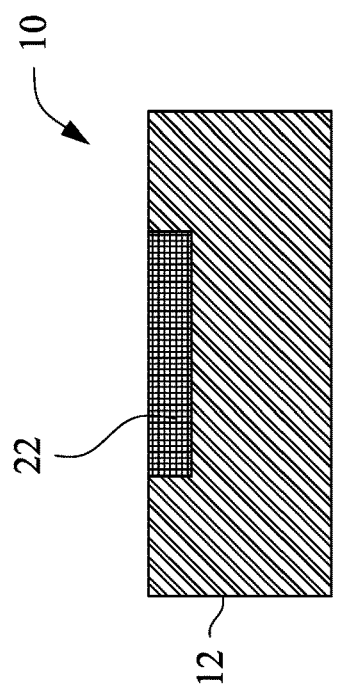

Applying microwave radiation to the semiconductor device 10 causes localized heating of the semiconductor device 10, including the first and second metal layers 18, 20. In some embodiments, the temperature of the first and second metal layers 18, 20 increases from ambient temperature to a temperature ranging from about 200° C. to about 600° C. during the exposure to the microwave radiation. In other embodiments, the temperature of the first and second metal layers 18, 20 increases to a temperature ranging from about 300° C. to about 500° C. during exposure to the microwave radiation. The heating of the first metal layer 18 and the second metal layer 20 causes the metals of the first and second metal layers 18, 20 to diffuse into the semiconductor substrate 12 and form an alloy layer 22 with the semiconductor substrate 12, as shown in FIG. 8. In certain embodiments, a ternary alloy layer 22 is formed.

In certain embodiments, the first metal layer 18 is a 6 nm to 14 nm thick sputter deposited layer of Ni, and the second metal layer 20 is a 5 nm to 15 nm thick physical vapor deposited layer of Pt on a germanium substrate 12. In certain embodiments, the first metal layer 18 and the second metal layer 20 each have a thickness of about 10 nm. The alloy layer 22 includes a ternary alloy of Ni, Ge, and Pt (NiGePt) in some embodiments. In certain embodiments, the ternary alloy layer includes $NiGePt_2$.

Depending on the metal material, the thickness of the first metal layer 18 has an affect on whether the ternary alloy will form when the metal layers 18, 20 are exposed to microwave radiation. For example, when the first metal layer 18 is Pt and the second metal layer 20 is Ni, a ternary alloy layer 22 will not be formed if the first metal layer 18 thickness is less than 6 nm or greater than 14 nm. If the thickness of the Pt first metal layer 18 is less than 6 nm, the Ni second metal layer 20 will readily pass through the Pt layer into the semiconductor substrate 12, and a ternary alloy layer 22 will not form. On the other hand, if the thickness of the Pt first metal layer is greater than 14 nm, Ni will not sufficiently diffuse into the semiconductor substrate 12 to form a ternary alloy layer 22. When the thickness of the Pt first metal layer 18 is between 5 nm and 14 nm, in certain embodiments, Pt and Ni both sufficiently diffuse into the semiconductor substrate 12 and sufficient thermal energy accumulates in the semiconductor substrate 12 to form a ternary alloy layer 22 of Pt, Ni, and Ge.

In some embodiments, the thickness of the ternary alloy layer 22 is about 15 nm to about 70 nm. In other embodiments, the thickness of the ternary alloy layer 22 is about 25 nm to about 60 nm.

In some embodiments, the atomic ratio of Ni/Pt in the NiGePt ternary alloy layer 22 is about 3.5 to about 1.1.

Figure 9:
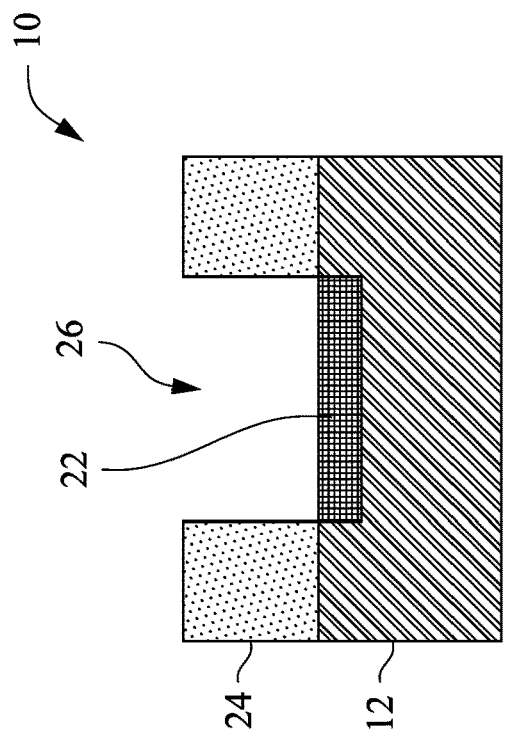

An insulating layer 24 having a second opening 26 exposing ternary alloy layer 22 is subsequently formed in some embodiments, as shown in FIG. 9. The insulating layer 24 is an oxide or nitride, such as silicon oxide or silicon nitride in some embodiments. The insulating layer 24 can be formed by any suitable deposition operation, including CVD, PECVD, LPCVD, and ALD. The insulating layer 24 is patterned by lithographic and etching operations to form the opening 26.

Figure 11:
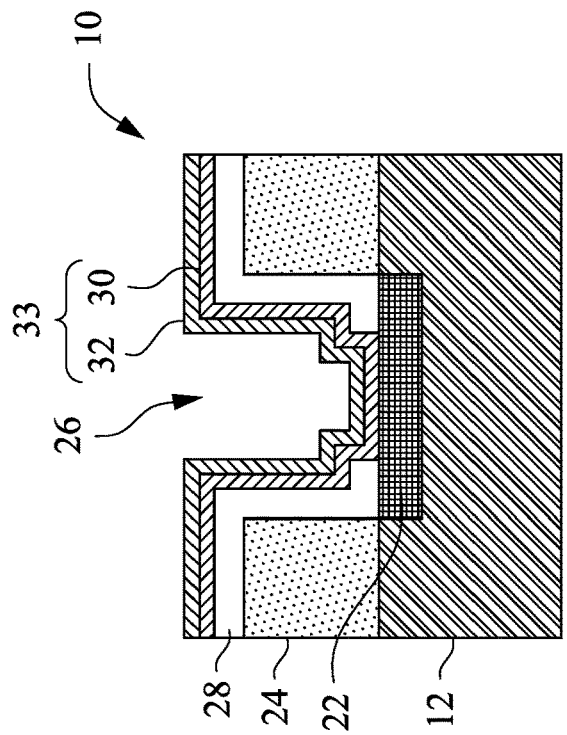
Figure 10:
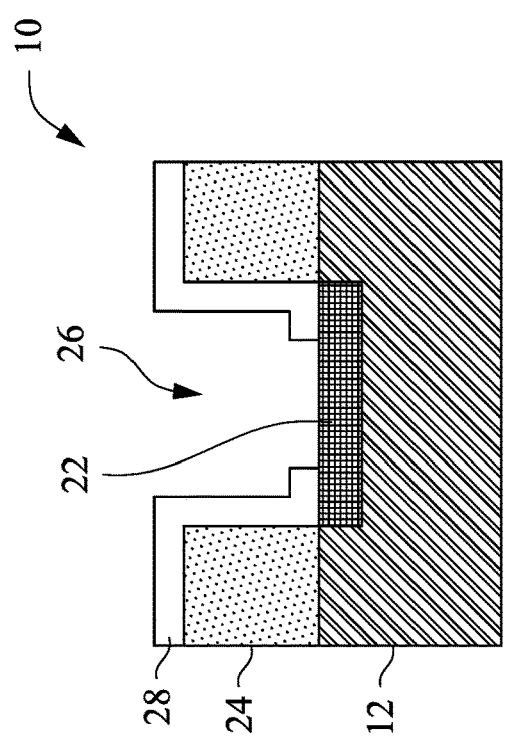

Adverting to FIG. 10, a second photoresist layer 28 is formed on the insulating layer 24. The second photoresist layer 28 is patterned using photolithographic operations to expose a portion of the ternary alloy layer 22, and upper contact layer 33 is formed in contact with the ternary alloy layer 22, as shown in FIG. 11. The upper contact layer 33 is formed of a conductive material, such as a metal. In some embodiments, the metal is at least one selected from the group consisting of Al, Cu, Ti, and W. In some embodiments, the upper contact layer 33 includes a plurality of contact layers 30, 32, as shown in FIG. 11. In some embodiments, the upper contact layer 33 includes a bilayer including a first contact layer 30 of Ti and a second contact layer 32 of Al. The thickness of the first contact layer 30 is about 10 nm to about 50 nm and the thickness of the second contact layer 32 is about 20 nm to about 60 nm in some embodiments. In certain embodiments, the overall upper contact layer 33 thickness is about 30 nm to about 110 nm.

Figure 12:
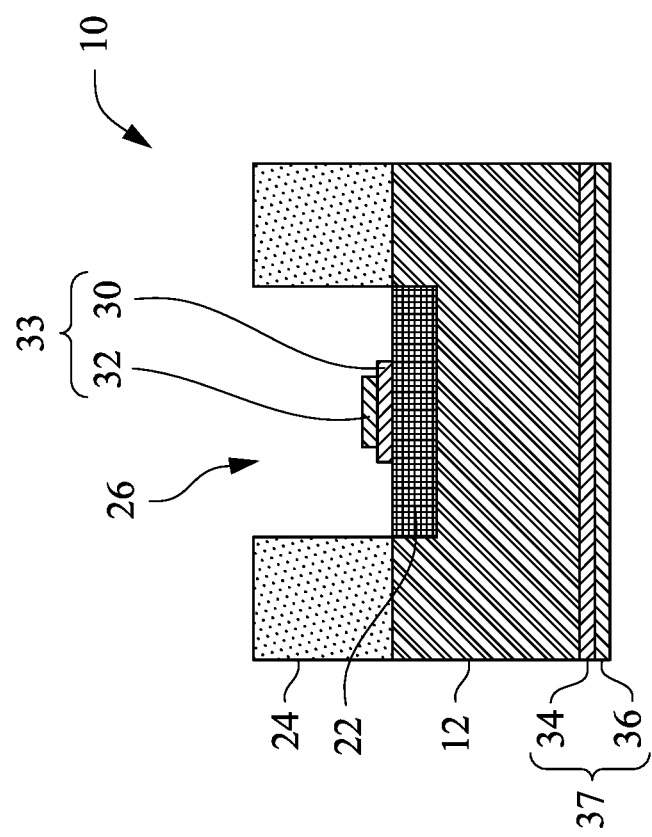

Adverting to FIG. 12, in some embodiments, after the upper contact layer 33 is deposited, the second photoresist layer 28 and first and second contact layers 30, 32 overlying the second photoresist layer 28 are removed by a lift-off operation using an appropriate photoresist solvent. A lower contact layer 37 is formed on an opposing surface of the semiconductor substrate 12 from the upper contact layer 33, as shown in FIG. 12 in some embodiments. The lower contact layer 37 is formed of a conductive material, such as a metal. In some embodiments, the metal is selected from the group consisting of Al, Cu, Ti, and W. In some embodiments, the lower contact layer 37 includes a plurality of contact layers 34, 36, as shown in FIG. 12. In some embodiments, the lower contact layer 37 includes a bilayer including a first contact layer 34 of Ti and a second contact layer 36 of Al. The metal contact layers 30, 32, 34, 36 may be formed by any suitable technique including CVD, PECVD, LPCVD, sputtering, PVD, ALD, and electroplating. The thickness of the first contact layer 30 is about 10 nm to about 50 nm and the thickness of the second contact layer 32 is about 20 nm to about 60 nm in some embodiments. In certain embodiments, the overall upper contact layer 33 thickness is about 30 nm to about 110 nm. The thickness of the first contact layer 34 is about 10 nm to about 50 nm and the thickness of the second contact layer 36 is about 20 nm to about 60 nm in some embodiments. In certain embodiments, the overall lower contact layer 37 thickness is about 30 nm to about 110 nm.

Figure 13:
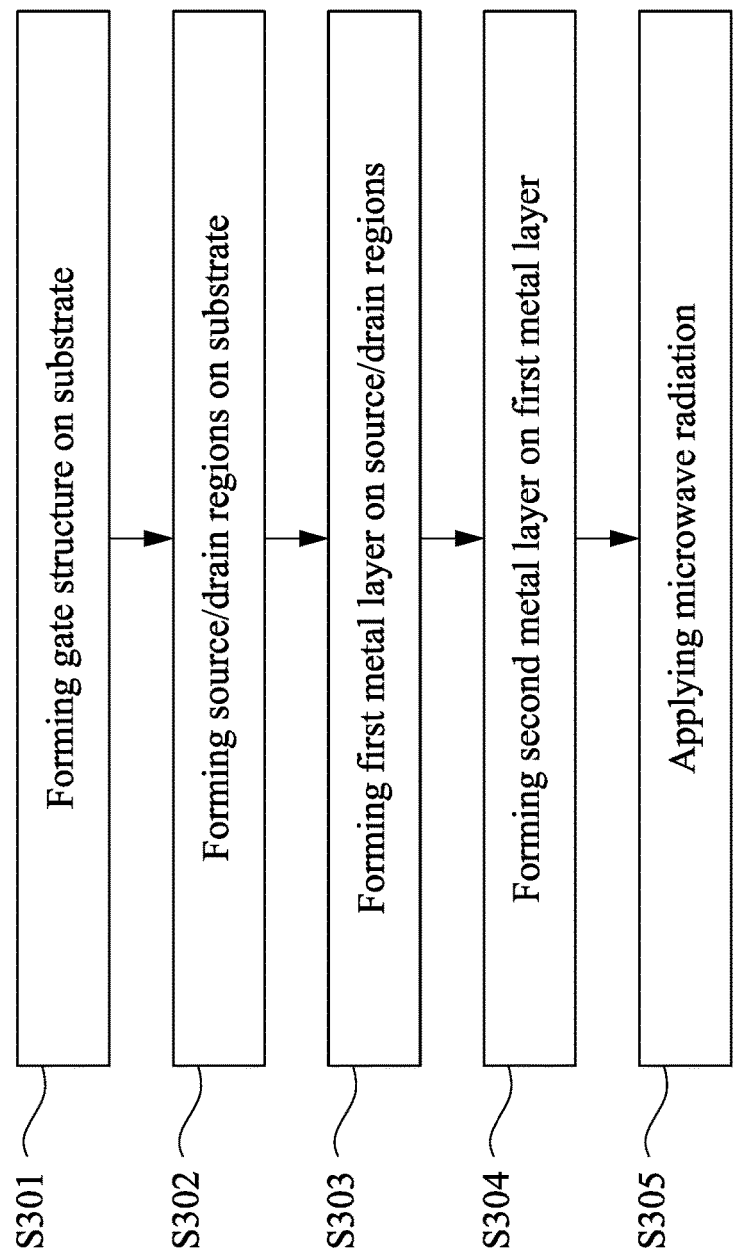
FIG. 13 is a flowchart showing a method of manufacturing a semiconductor device according to an embodiment of the present disclosure.

Another method of manufacturing a semiconductor device according to some embodiments of the disclosure includes an operation S301 of forming a gate structure on a semiconductor substrate and an operation S302 of forming source/drain regions on the semiconductor substrate, as shown in FIG. 13. In this disclosure, a source and a drain are interchangeably used and the structures thereof are substantially the same. A first metal layer is formed on the source/drain regions in operation S303, and a second metal layer is formed on the first metal layer in operation S304. Microwave radiation is subsequently applied to the semiconductor substrate, first metal layer, and second metal layer in operation S305.

Figure 14:
FIG. 14 is a flowchart showing a method of manufacturing a semiconductor device according to an embodiment of the present disclosure.

Another method for manufacturing a semiconductor device according to some embodiments of the disclosure includes an operation S401 of forming source/drain regions on a semiconductor substrate and an operation 402 of forming a first metal layer over the source/drain regions, as shown in FIG. 14. A second metal layer is formed on the source/drain regions in operation S403, and microwave radiation is subsequently applied to the semiconductor substrate, first metal layer, and second metal layer in operation S404. In operation S405, a high-k insulating layer is formed over the semiconductor substrate, and a conductive metal layer is formed over the high-k insulating layer in operation S406 in a region between the source/drain regions. Conductive contacts are subsequently formed over the source/drain regions in operation S407.

FIGS. 15-23 depict a method for manufacturing a field effect transistor semiconductor device 100 according to an embodiment of the present disclosure. As shown in FIG. 15, a gate dielectric layer 42 is formed over a semiconductor substrate 40, and a gate electrode layer 44 is formed over the gate dielectric layer 42.

In some embodiments, the semiconductor substrate 40 may comprise a single crystalline semiconductor material such as, but not limited to Si, Ge, and SiGe. In a certain embodiment, the semiconductor substrate 40 is made of Ge. In certain embodiments, the semiconductor substrate 40 is subjected to a cleaning operation, such as exposing the surface of the semiconductor substrate 40 on which the mask will be deposited to dilute hydrofluoric acid (DHF).

The semiconductor substrate 40 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the uppermost layer of the semiconductor substrate 40 is made of Ge, and the buffer layer is silicon germanium (SiGe) epitaxially grown on a silicon base layer. The germanium concentration of the SiGe buffer layers may increase from 30 atomic % for the bottom-most buffer layer to 70 atomic % for the top-most buffer layer.

The gate dielectric layer 42 is formed of an oxide or nitride of the semiconductor substrate material, such as a silicon oxide or germanium oxide in some embodiments. The oxide is formed by thermal oxidation of an upper surface of the semiconductor substrate in some embodiments, while in other embodiments, the oxide is formed by a deposition operation, including CVD, LPCVD, PECVD, PVD, and ALD. In some embodiments, the gate dielectric layer 42 includes one or more layers of a high-k dielectric material. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof formed by a deposition operation, including CVD, LPCVD, and PECVD. In some embodiments, the gate dielectric layer 42 includes an interfacial layer (not shown) formed between the semiconductor substrate 40 and the dielectric material.

The source/drain regions include heavily doped regions containing a dopant at a concentration of greater than $10^{20}$ atoms $cm^{-3}$ in certain embodiments. The source/drain regions are formed by epitaxy in some embodiments.

In some embodiments, the gate electrode layer 44 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 44 may be formed by CVD, LPCVD, PECVD, ALD, PVD, e-beam evaporation, electroplating, or other suitable method.

In certain embodiments of the present disclosure, one or more work function adjustment layers (not shown) are interposed between the gate dielectric layer 42 and the gate electrode layer 44. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. The work function adjustment layer may be formed by ALD, PVD, CVD, e-beam evaporation, or other suitable process.

In some embodiments, the semiconductor substrate 40 is made of Ge, the gate dielectric layer 42 is a bilayer including a first layer of $GeO_2$ disposed on the semiconductor substrate 40 and a second layer of $Al_2O_3$ disposed on the first layer, and the gate electrode layer 44 is Al.

Figure 18:
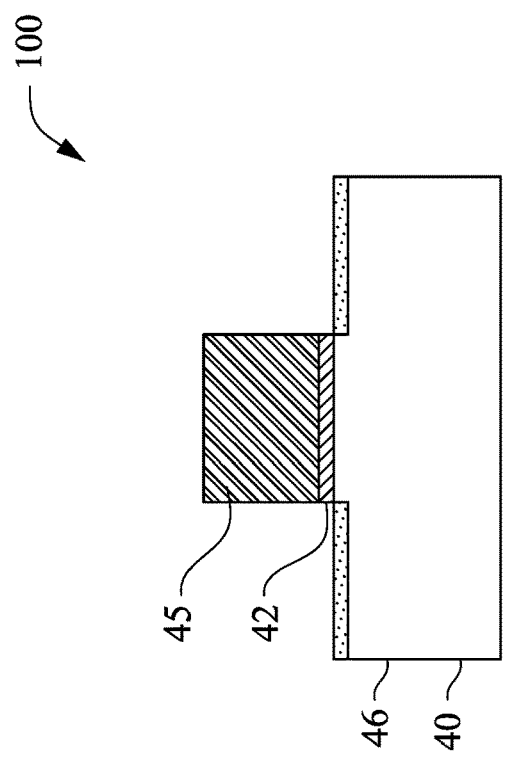
Figure 17:
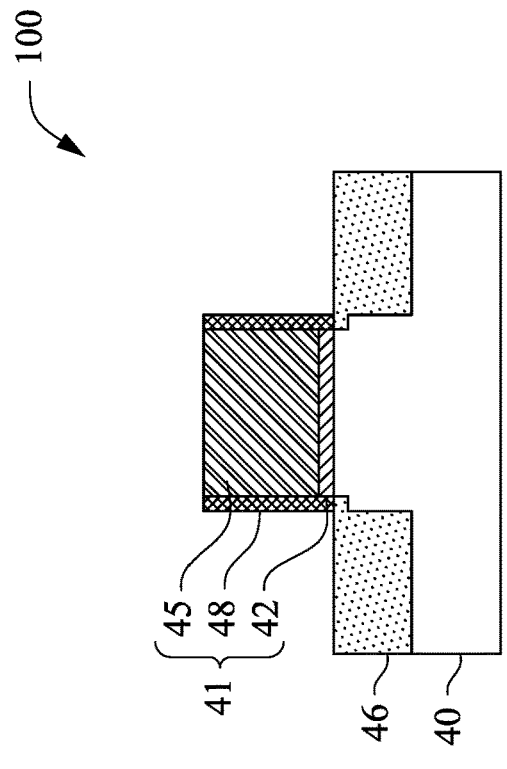

As shown in FIG. 16, the gate dielectric layer 42 and gate electrode layer 44 are patterned using lithographic and etching operations to form a gate electrode structure 41 including the gate dielectric layer 42 and a gate electrode 45. Using the patterned gate dielectric layer 42 and gate electrode 45 as a mask, dopant is implanted into the semiconductor substrate 40 to form source/drain regions 46, as shown in FIG. 17. Gate insulating sidewalls 48, formed on the sidewalls of the gate dielectric layer 42 and gate electrode 45, are subseqently added to the gate electrode structure 41, as shown in FIG. 18, and additional dopant is implanted into source/drain regions 46 to increase the dopant concentration and expand the source/drain regions 46. The gate insulating sidewalls 48 include one or more layers of an insulating oxide and/or nitride in some embodiments. The source/drain regions 46 contain a dopant at a concentration of greater than $10^{20}$ atoms cm$^{-3}$ in some embodiments.

Figure 19:
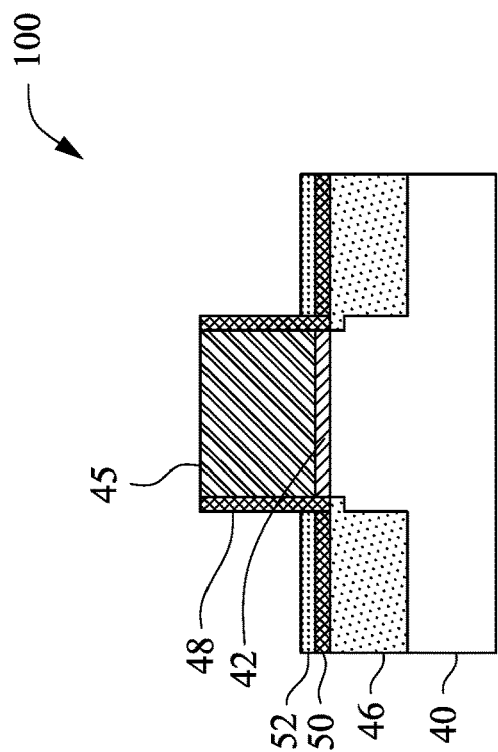

Adverting to FIG. 19, a first metal layer 50 is formed on the source/drain regions 46 by a suitable deposition technique, such as sputtering or physical vapor deposition. In some embodiments, the first metal layer 50 is formed to a thickness of about 3 nm to about 30 nm. In certain embodiments, the thickness of the first metal layer 50 ranges from about 6 nm to about 14 nm. The first metal layer 50 is at least one selected from the group consisting of Ni, Pt, Au, Ta, Gd, Ti, Ge, and Si in some embodiments.

A second metal layer 52 is formed on the first metal layer 50 by a suitable deposition technique, such as sputtering or physical vapor deposition. In some embodiments, the second metal layer 52 is formed to a thickness of about 3 nm to about 30 nm. In certain embodiments, the thickness of the second metal layer 52 ranges from about 5 nm to about 15 nm. The second metal layer 52 is at least one selected from the group consisting of Ni, Pt, Au, Ta, Gd, Ti, Ge, and Si in some embodiments. The second metal is a different metal than the first metal.

Portions of the first and second metal layers 50, 52 that are deposited on the gate electrode 45 and upper surfaces of the gate insulating sidewalls 48 are removed by lithographic and etching operations, thereby confining the first and second metal layers 50, 52 to overlying the source/drain regions 46.

Figure 20:
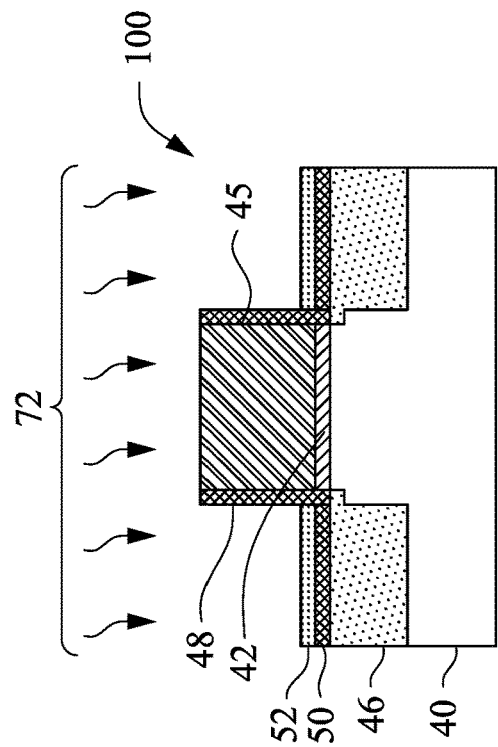

After the second metal layer is deposited, microwave-activated annealing operation is performed to form an alloy contact with the source/drain regions 46. The microwave-activated annealing operation includes applying microwave radiation 72 to the semiconductor substrate 40, first metal layer 50, and second metal layer 52, as shown in FIG. 20. In some embodiments, the microwave radiation is applied at frequency range of about 1 GHz to about 30 GHz and at a power of about 0.6 kW to about 4.4 kW for about 40 seconds to about 240 seconds. In other embodiments, is applied at a power of about 1.2 kW to about 2.2 kW for about 80 seconds to about 120 seconds. In certain embodiments, the semiconductor device 40 is exposed to microwave radiation in an inert atmosphere, such as a nitrogen atmosphere.

Figure 21:
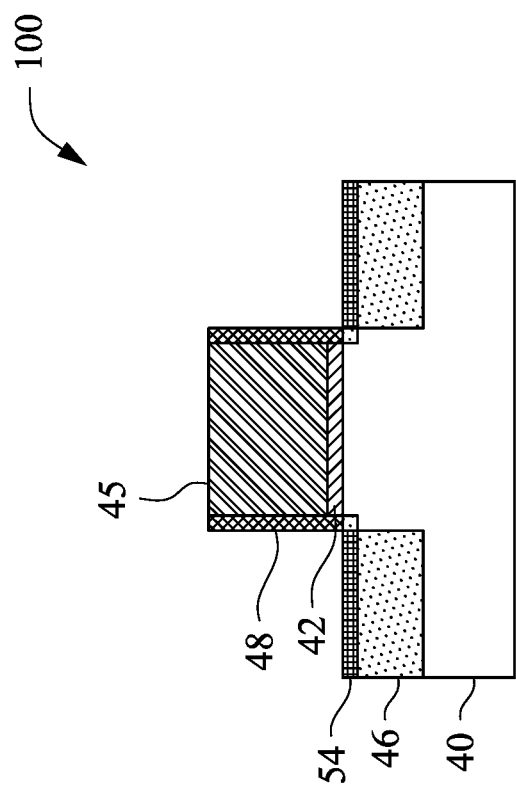

Applying microwave radiation to the semiconductor device 100 causes localized heating of the semiconductor device 100, including the first and second metal layers 50, 52, as explained herein regarding FIGS. 7 and 8 to produce a ternary alloy layer 54, as shown in FIG. 21.

In some embodiments, the temperature of the first and second metal layers 50, 52 and the source/drain regions 46 increases from ambient temperature to a temperature ranging from about 200° C. to about 600° C. during the exposure to microwave radiation. In other embodiments, the temperature increases to about 300° C. to about 500° C. during exposure to the microwave radiation. When the localized heating is to a temperature less than or equal to about 600° C., dopants in the source/drain regions 46 are less likely to diffuse.

Figure 22:
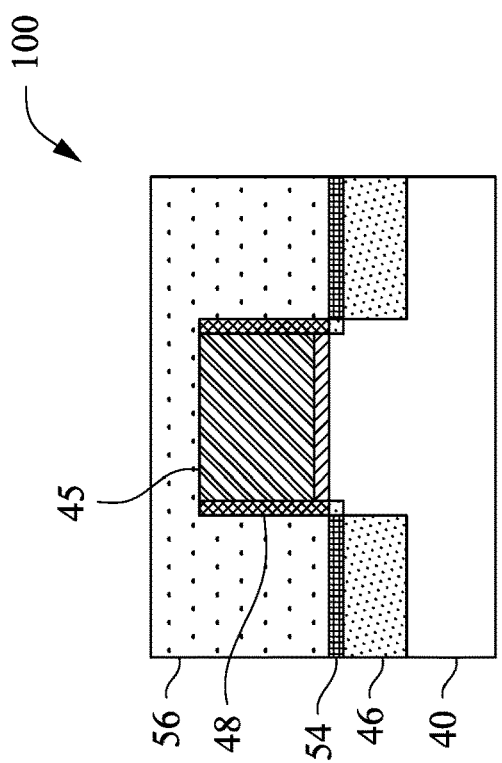

In some embodiments, an interlayer dielectric (ILD) 56 is formed over the gate electrode 45 and tertiary alloy layers 54, as shown in FIG. 22. The materials for the ILD layer 56 include compounds comprising Si, O, C and/or H, such as SiCOH and SiOC. Organic material, such as polymers, may be used for the ILD layer 56. The ILD 56 can be formed by LPCVD, PECVD, or flowable CVD. In the flowable CVD (FCVD), flowable dielectric materials instead of silicon oxide are deposited over a substrate. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These precursors may be combined with gases such as $O_2$, $O_3$, $N_2$, Ar, $H_2$, He, and/or $NH_3$. Plasma-CVD may be used in the FCVD.

Figure 23:
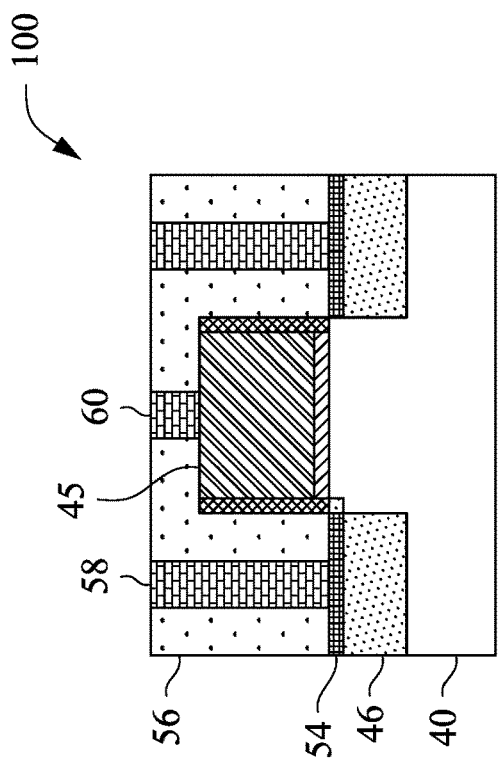

In some embodiments, openings are formed in the ILD 56 over the ternary alloy layer 54 and gate electrode 45 using lithographic and etching operations, and the openings are filled with a conductive material, such as a metal, to form source/drain contacts 58 and gate electrode 60 contacts, as shown in FIG. 23. In some embodiments, the source/drain contacts 58 and gate electrode contact 60 include one or more metals selected from the group consisting of Al, Cu, Ti, and W. In some embodiments, a barrier layer is formed in the opening before depositing the contact metal.

FIGS. 24-31 depict another method for manufacturing a field effect transistor semiconductor device 200 according to an embodiment of the present disclosure. Many of the operations for forming the field effect transistor according to this embodiment are the same or similar as the method described in FIGS. 15-23. The main difference is that FIGS. 15-23 depict a gate first method, while FIGS. 24-31 depict a gate last method.

Figure 24:
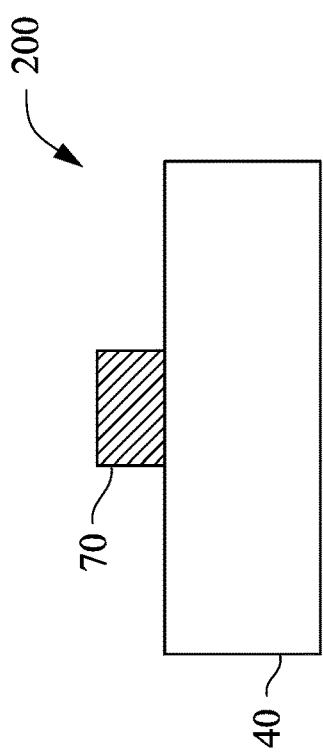

As shown in FIG. 24, a mask 70 is formed on a semiconductor substrate 40 using deposition, lithographic, and etching operations. The mask may be formed by depositing a masking material layer, such as silicon oxide and/or silicon nitride, and patterning the deposited masking material layer. The semiconductor substrate 40 may be formed of any of the materials disclosed herein.

Figure 25:
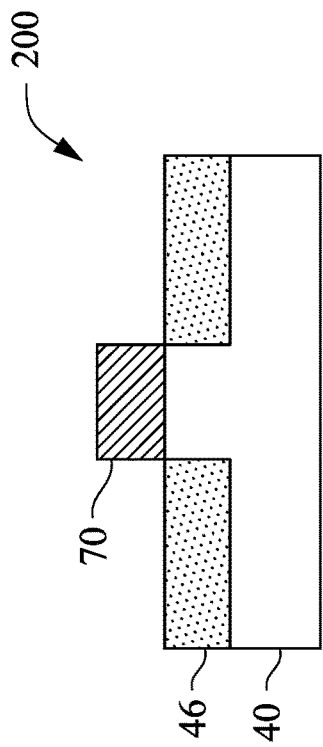
FIGS. 24-31 depict a method for manufacturing a field effect transistor semiconductor device according to an embodiment of the present disclosure.

Spaced-apart source/drain regions 46 are formed in the semiconductor substrate 46 on opposing sides of the mask 70 by implanting a dopant into the semiconductor substrate 40, as shown in FIG. 25. The source/drain regions 46 contain a dopant at a concentration of greater than $10^{20}$ atoms cm$^{-3}$ in some embodiments.

Figure 26:
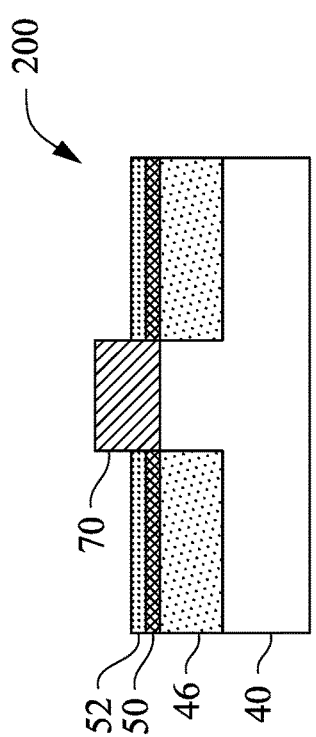

Adverting to FIG. 26, a first metal layer 50 is formed on the source/drain regions 46 to a thickness of about 3 nm to about 30 nm. In certain embodiments, the thickness of the first metal layer 50 ranges from about 6 nm to about 14 nm. The first metal layer 50 is at least one selected from the group consisting of Ni, Pt, Au, Ta, Gd, Ti, Ge, and Si in some embodiments.

A second metal layer 52 is formed on the first metal layer 50 to a thickness of about 3 nm to about 30 nm. In certain embodiments, the thickness of the second metal layer 52 ranges from about 5 nm to about 15 nm. The second metal layer 52 is at least one selected from the group consisting of Ni, Pt, Au, Ta, Gd, Ti, Ge, and Si in some embodiments. The second metal is a different metal than the first metal.

Portions of the first and second metal layers 50, 52 that are deposited on the upper surface of the mask 70 are removed by lithographic and etching operations in some embodiments, thereby confining the first and second metal layers 50, 52 to overlying the source/drain regions 46.

Figure 27:
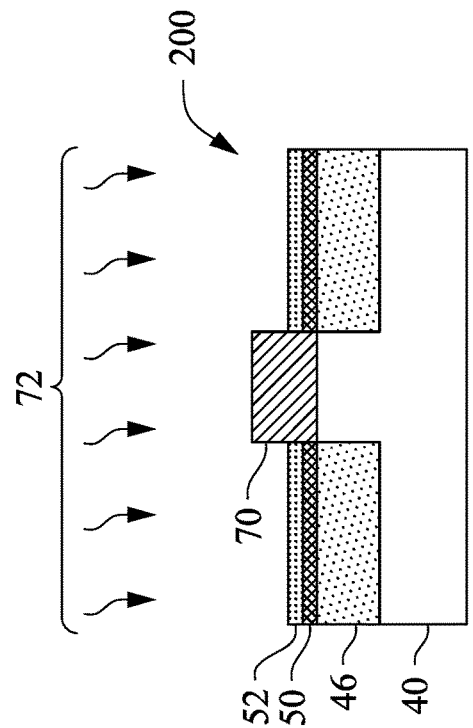

In some embodiments, after the second metal layer is deposited, a microwave-activated annealing operation is performed to form an alloy contact with the source/drain regions 46. The microwave-activated annealing operation includes applying microwave radiation 72 to the semiconductor substrate 40, first metal layer 50, and second metal layer 52, as shown in FIG. 27. In some embodiments, the microwave radiation is applied at frequency range of about 1 GHz to about 30 GHz and at a power of about 0.6 kW to about 4.4 kW for about 40 seconds to about 240 seconds. In other embodiments, the microwave radiation is applied at a power of about 1.2 kW to about 2.2 kW for about 80 seconds to about 120 seconds. In certain embodiments, the semiconductor device 200 is exposed to microwave radiation in an inert atmosphere, such as a nitrogen atmosphere.

Figure 28:
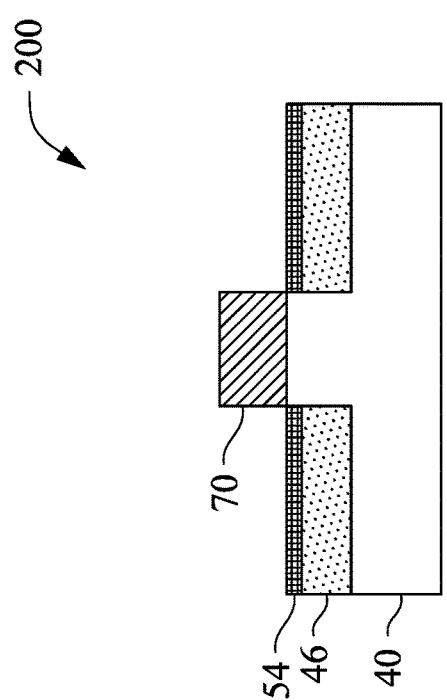

Applying microwave radiation to the semiconductor device 200 causes localized heating of the semiconductor device 200, including the first and second metal layers 50, 52, as explained herein regarding FIGS. 7, 8, 20, and 21 to produce a ternary alloy layer 54, as shown in FIG. 28.

Figure 29:
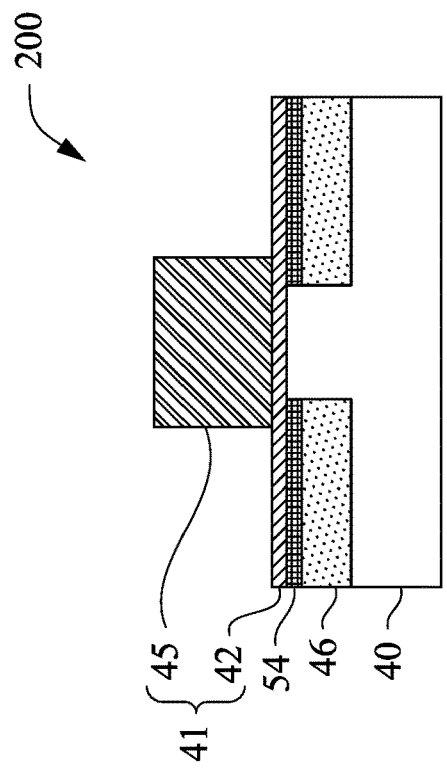

The mask 70 is subsequently removed and a gate dielectric layer 42 and gate electrode 45 are formed on the semiconductor substrate 40, as shown in FIG. 29. The gate electrode 45 is patterned by suitable patterning operations, including lithographic and etching operations to form a gate electrode.

The gate dielectric layer 42 is formed of an oxide or nitride of the semiconductor substrate material, such as a silicon oxide or germanium oxide in some embodiments. The oxide is formed by thermal oxidation of an upper surface of the semiconductor substrate in some embodiments, while in other embodiments, the oxide is formed by a deposition operation, including CVD, LPCVD, and PECVD. In some embodiments, the gate dielectric layer 42 includes one or more layers of a high-k dielectric material. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof formed by a deposition operation, including CVD, LPCVD, and PECVD. In some embodiments, the gate dielectric layer 42 includes an interfacial layer (not shown) formed between the channel layers and the dielectric material.

In some embodiments, the gate electrode 45 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) are interposed between the gate dielectric layer 42 and the gate electrode 45.

Figure 30:
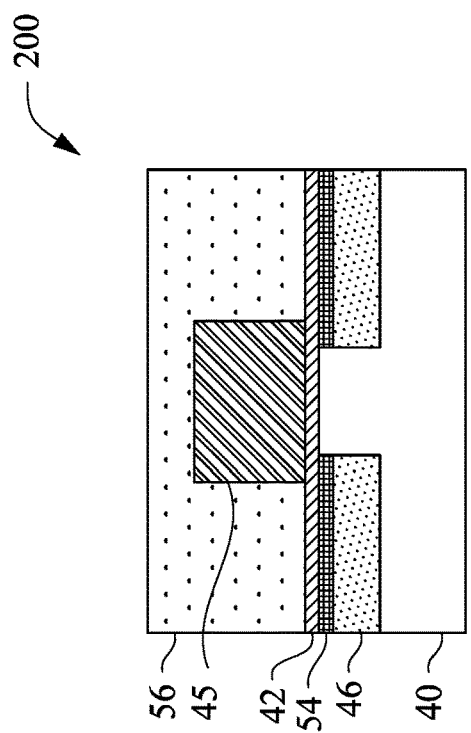

In some embodiments, an interlayer dielectric (ILD) 56 is formed over the gate electrode 45 and source/drain regions 46, as shown in FIG. 30.

Figure 31:
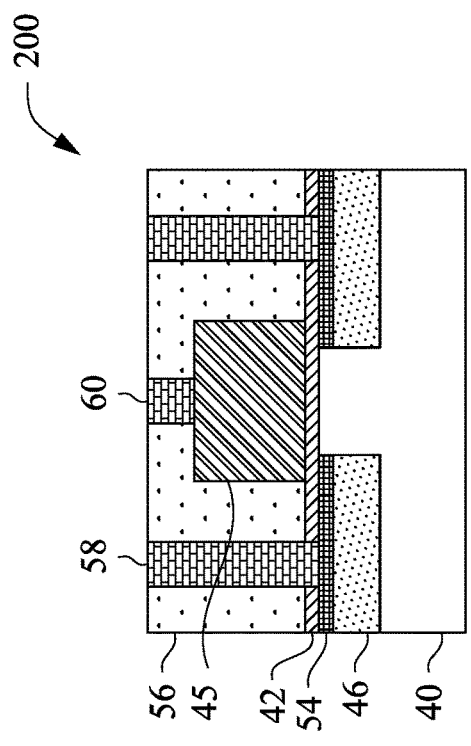

In some embodiments, openings are formed in the ILD 56 and gate dielectric layer 42 over the ternary alloy layer 54 and in the ILD 56 overlying the gate electrode 45 using lithographic and etching operations, and the openings are filled with a conductive material, such as a metal to form source/drain contacts 58 and gate electrode 60 contacts, as shown in FIG. 31. In some embodiments, the source/drain contacts 58 and gate electrode 60 include one or more metals selected from the group consisting of Al, Cu, Ti, and W. In some embodiments, a barrier layer is formed in the opening before depositing the contact metal.

The disclosed methods are applicable to planar transistor devices and finFET devices. An embodiment of a method of manufacturing a finFET device 300 according to the present disclosure is depicted in FIGS. 32A-34B.

A plan view (overhead view) of a finFET device 300 is shown in FIG. 32A. The finFET device 300 includes a gate electrode structure 85 disposed over a fin structure 80. FIG. 32B is a cross section view corresponding to line A-A' of FIG. 32A. FIG. 32C is a cross section view corresponding to line B-B' of FIG. 32A. FIG. 32D is a cross section view corresponding to line C-C' of FIG. 32A.

As shown in FIGS. 32A-32D, the gate electrode structure 85 includes a gate electrode 84, insulating gate sidewall 86, and gate dielectric layer 88. The fin structure 80 protrudes from an interlayer dielectric (ILD) 90. The fin structures 80 are formed by patterning a semiconductor substrate 92 in some embodiments. The fin structure 80 includes source/drain regions 82 on opposing sides of the gate electrode structure 85 and a channel region 83 underlying the gate electrode structure 85. Portions of the first and second metal layers 94, 96 that are deposited on the gate electrode 84 and upper surfaces of the gate insulating sidewalls 86 are removed by lithographic and etching operations, thereby confining the first and second metal layers 94, 96 to overlying the source/drain regions 82. The channel region 83, is the portion of the fin structure 80 protruding from the ILD 90.

A first metal layer 94 is formed on the source/drain regions 82 and a second metal layer 96 is formed on the first metal layer 94. As explained herein with respect to FIGS. 19 and 26, the first metal layer 94 is formed to a thickness of about 3 nm to about 30 nm, in certain embodiments, and the thickness of the first metal layer 94 ranges from about 6 nm to about 14 nm in other embodiments. The first metal layer 94 is at least one selected from the group consisting of Ni, Pt, Au, Ta, Gd, Ti, Ge, and Si in some embodiments. The second metal layer 96 is formed on the first metal layer 94 to a thickness of about 3 nm to about 30 nm. In certain embodiments, the thickness of the second metal layer 96 ranges from about 5 nm to about 15 nm. The second metal layer 96 is at least one selected from the group consisting of Ni, Pt, Au, Ta, Gd, Ti, Ge, and Si in some embodiments. The second metal is a different metal than the first metal.

As shown in FIG. 33A, a cross section view corresponding to line B-B' of FIG. 32A, and FIG. 33B, a cross section view corresponding to line C-C' of FIG. 32A, a microwave-activated annealing operation is performed to form an alloy contact with the source/drain regions 82. The microwave-activated annealing operation includes applying microwave radiation 72 to the fin structure 80, first metal layer 94, and second metal layer 96. In some embodiments, the microwave radiation is applied at frequency range of about 1 GHz to about 30 GHz and at a power of about 0.6 kW to about 4.4 kW for about 40 seconds to about 240 seconds. In other embodiments, is applied at a power of about 1.2 kW to about 2.2 kW for about 80 seconds to about 120 seconds. In certain embodiments, the finFET device 300 is exposed to microwave radiation in an inert atmosphere, such as a nitrogen atmosphere.

Applying microwave radiation to the finFET device 300 causes localized heating of the finFET device 300, including the first and second metal layers 94, 96, as explained herein regarding FIGS. 20, 21, 27, and 28, to produce a ternary alloy layer 98, as shown in FIGS. 34A and 34B. FIG. 34A corresponds to line B-B' of FIG. 32A, and FIG. 34B corresponding to line C-C' of FIG. 32A.

It is understood that additional operations can be provided before, during, and after processes described herein, and some of the operations described above can be replaced or eliminated for additional embodiments of the method. The order of the operations/processes may be interchangeable. It is further understood that the illustrated devices undergo further processing to form various features such as interconnect metal layers, dielectric layers, passivation layers, etc.

Figure 35:
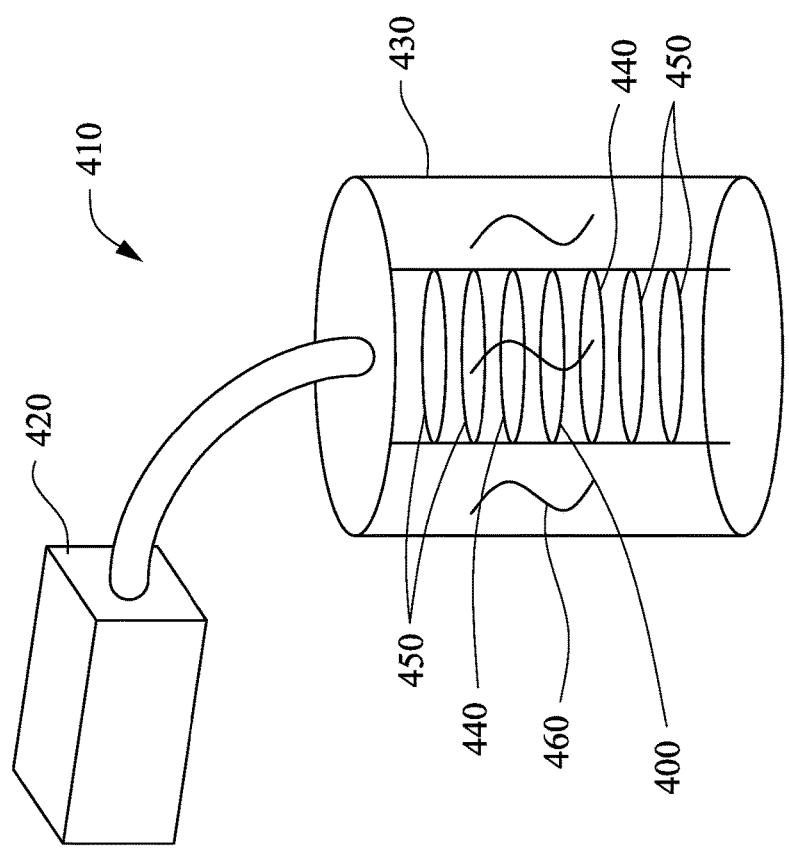
FIG. 35 depicts a microwave system for applying microwave radiation to a semiconductor device according to an embodiment of the present disclosure.

In some embodiments, the semiconductor device 10, 100, 200, and finFET device 300 is disposed on a semiconductor wafer 400 when it is exposed to microwave-activated annealing. In certain embodiments, the semiconductor wafer 400 is disposed in a microwave system 410, as shown in FIG. 35. The microwave system 410, may include a microwave generator 420, generating microwaves 460 at a frequency in the range of about 1 GHz to about 30 GHz at a power of about 0.6 kW to about 4.4 kW, and a processing chamber 430, in which the semiconductor wafer 400 is exposed to the microwave radiation. The processing chamber 430 includes a plurality of susceptor plates 440 and quartz plates 450 arranged on opposing sides of the semiconductor wafer 400. In some embodiments, the susceptor plates 440 are formed of a semiconductor material, such as doped silicon or doped silicon carbide.

Rapid thermal annealing can degrade the metal surface and the interface between the alloy contact and the semiconductor substrate. Microwave-activated annealing according to the present disclosure can prevent interface roughness and severe agglomeration which can result from rapid thermal annealing. Microwave-activated annealing according to the present disclosure provides uniform heating at a lower temperature than rapid thermal annealing. Microwave-activated annealing can provide a shallow junction with improved junction interface, surface quality, and reduced contact resistance. The relatively low temperature of microwave-activated annealing compared to rapid thermal annealing also suppresses dopant diffusion from the source/drain regions.

In certain embodiments, microwave-activated annealing according to the present disclosure can improve Schottky contacts on Si, Ge, SiGe semiconductor substrates in a PFET device, and can improve ohmic contacts on Si, Ge, and SiGe semiconductor substrates in an NFET device.

According to one embodiment of the disclosure, a method of manufacturing a semiconductor device includes forming a first metal layer on a semiconductor substrate and forming a second metal layer on the first metal layer. The second metal layer is formed of a different metal than the first metal layer. Microwave radiation is applied to the semiconductor substrate, first metal layer, and second metal layer to form an alloy comprising components of the first metal layer, second metal layer, and the semiconductor substrate.

According to another embodiment of the disclosure, a method of manufacturing a field effect transistor includes forming a gate structure over a first region of a semiconductor substrate. A pair of source/drain regions is formed in second regions of the semiconductor substrate. The second regions are located on opposing sides of the first region. A first metal layer is formed over the source/drain regions, and a second metal layer is formed on the first metal layer. The second metal layer is formed of a different metal than the first metal layer. Microwave radiation is applied to the semiconductor substrate, first metal layer, and second metal layer to form an alloy comprising components of the first metal layer, second metal layer, and the semiconductor substrate.

According to another embodiment of the disclosure, a method of manufacturing a semiconductor device includes forming a pair of spaced-apart source/drain regions in a semiconductor substrate. A first metal layer is formed over the source/drain regions, and a second metal layer is formed on the first metal layer. The second metal layer is formed of a different metal than the first metal layer. Microwave radiation is applied to the semiconductor substrate, first metal layer, and second metal layer to form an alloy comprising components of the first metal layer, second metal layer, and the semiconductor substrate on the source/drain regions. A high-k insulating layer is formed over the semiconductor substrate, and a conductive metal layer is formed over the high-k insulating layer in a region between the spaced-apart source/drain regions. Conductive contacts are formed over the source/drain regions.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first metal layer on a semiconductor substrate;
   forming a second metal layer on the first metal layer, wherein the second metal layer is formed of a different metal than the first metal layer; and
   applying microwave radiation to the semiconductor substrate, first metal layer, and second metal layer to form an alloy comprising components of the first metal layer, second metal layer, and the semiconductor substrate,
   wherein the microwave radiation is applied at a power of about 0.6 kW to about 4.4 kW for about 40 seconds to about 240 seconds, and
   the alloy is a $NiGePt_2$ ternary alloy.

2. The method according to claim 1, wherein the semiconductor substrate comprises a pair of source/drain regions spaced apart from each other, and in the forming the first metal layer the first metal layer is disposed on the source/drain regions.

3. The method according to claim 1, wherein the microwave radiation is applied for about 80 seconds to about 120 seconds.

4. The method according to claim 1, wherein the semiconductor substrate comprises Si, Ge, or SiGe.

5. The method according to claim 1, wherein the first and second metal layers are selected from the group consisting of Ni, Pt, Au, Ta, Gd, Ti, Ge, Si, and combinations thereof.

6. The method according to claim 1, wherein the first metal layer comprises Pt and the second metal layer comprises Ni.

7. The method according to claim 1, wherein the first metal layer is formed by a sputtering operation.

8. The method according to claim 1, wherein the microwave radiation is applied at a power of about 1.2 kW to about 2.2 kW.

9. A method of manufacturing a field effect transistor, comprising:
 forming a gate structure over a first region of a semiconductor substrate;
 forming a pair of source/drain regions in second regions of the semiconductor substrate, wherein the second regions are located on opposing sides of the first region;
 forming a first metal layer over the source/drain regions;
 forming a second metal layer on the first metal layer,
 wherein the second metal layer is formed of a different metal than the first metal layer; and
 applying microwave radiation to the semiconductor substrate, first metal layer, and second metal layer to form an alloy comprising components of the first metal layer, second metal layer, and the semiconductor substrate,
 wherein the microwave radiation is applied at a power of about 1.2 kW to about 4.4 kW for about 40 seconds to about 240 seconds, and
 the alloy is a $NiGePt_2$ ternary alloy.

10. The method according to claim 9, wherein the first metal layer is formed by a sputtering operation.

11. The method according to claim 10, wherein the first metal layer comprises a layer having a thickness of about 6 nm to about 14 nm.

12. The method according to claim 9, wherein the second metal layer is formed by a physical vapor deposition operation.

13. The method according to claim 12, wherein the second metal layer comprises a layer having a thickness of about 5 nm to about 15 nm.

14. The method according to claim 9, wherein the field effect transistor is a planar field effect transistor.

15. The method according to claim 9, wherein the semiconductor substrate comprises at least one fin formed thereon, the source/drain regions are formed on the at least one fin, and the gate structure overlies the at least one fin.

16. A method of manufacturing a semiconductor device, comprising:
 forming a pair of spaced-apart source/drain regions in a semiconductor substrate;
 forming a first metal layer over the source/drain regions;
 forming a second metal layer on the first metal layer,
 wherein the second metal layer is formed of a different metal than the first metal layer;
 applying microwave radiation to the semiconductor substrate, first metal layer, and second metal layer to form an alloy comprising components of the first metal layer, second metal layer, and the semiconductor substrate on the source/drain regions;
 forming a high-k insulating layer over the semiconductor substrate;
 forming a conductive metal layer over the high-k insulating layer in a region between the spaced-apart source/drain regions; and
 forming conductive contacts over the source/drain regions,
 wherein the alloy is a $NiGePt_2$ ternary alloy.

17. The method of manufacturing a semiconductor device according to claim 16, wherein the conductive contact comprises at least one metal selected from the group consisting of Al, Cu, Ti, and W.

18. The method of manufacturing a semiconductor device according to claim 16, wherein the first metal layer is formed by sputter depositing Pt to a thickness of about 6 nm to about 14 nm.

19. The method of manufacturing a semiconductor device according to claim 16, wherein the second metal layer is formed by depositing Ni by physical vapor deposition to a thickness of about 5 nm to about 15 nm.

20. The method according to claim 16, wherein the microwave radiation is applied for about 80 seconds to about 120 seconds.

* * * * *